United States Patent
Katsushi

(10) Patent No.: US 11,758,796 B2
(45) Date of Patent: Sep. 12, 2023

(54) ORGANIC LIGHT-EMITTING DISPLAY DEVICE AND MANUFACTURING METHOD THEREOF

(71) Applicant: Samsung Display Co., LTD., Yongin-si (KR)

(72) Inventor: Kishimoto Katsushi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 125 days.

(21) Appl. No.: 17/212,518

(22) Filed: Mar. 25, 2021

(65) Prior Publication Data

US 2022/0069263 A1    Mar. 3, 2022

(30) Foreign Application Priority Data

Aug. 28, 2020    (KR) .......................... 10-2020-0109102

(51) Int. Cl.
| | | |
|---|---|---|
| *H01L 51/56* | (2006.01) | |
| *H01L 27/32* | (2006.01) | |
| *H01L 51/52* | (2006.01) | |
| *H10K 71/00* | (2023.01) | |
| *H10K 50/813* | (2023.01) | |

(Continued)

(52) U.S. Cl.
CPC ............ *H10K 71/00* (2023.02); *H10K 50/813* (2023.02); *H10K 50/822* (2023.02); *H10K 59/122* (2023.02); *H10K 59/124* (2023.02); *H10K 59/1213* (2023.02); *H10K 59/352* (2023.02); *H10K 59/353* (2023.02);

(Continued)

(58) Field of Classification Search
CPC ... H01L 51/5206–5218; H01L 51/5265; H01L 27/3258; H01L 27/3216; H10K 50/81–818; H10K 50/852
See application file for complete search history.

(56) References Cited

U.S. PATENT DOCUMENTS

| | | | |
|---|---|---|---|
| 9,240,571 B2 * | 1/2016 | Kim ..................... | H01L 51/5206 |
| 10,204,966 B2 * | 2/2019 | Choi .................... | H01L 27/322 |

(Continued)

FOREIGN PATENT DOCUMENTS

| | | | | |
|---|---|---|---|---|
| CN | 104009186 A | * | 8/2014 | ......... H01L 51/5265 |
| CN | 111952342 A | * | 11/2020 | ............. H10K 50/85 |

(Continued)

OTHER PUBLICATIONS

Machine translation, Kim, Chinese Pat. Pub. No. CN-104009186-A, translation date: Sep. 21, 2022, Clarivate Analytics, all pages. (Year: 2022).*

(Continued)

*Primary Examiner* — Victoria K. Hall
(74) *Attorney, Agent, or Firm* — KILE PARK REED & HOUTTEMAN PLLC

(57) ABSTRACT

A light-emitting display device includes unit pixels each of which includes a first sub-pixel, a second sub-pixel, and a third sub-pixel. The first sub-pixel includes a red organic light-emitting layer to emit red light. The second sub-pixel includes a green organic light-emitting layer to emit green light. The third sub-pixel includes a blue organic light-emitting layer to emit blue light. A surface level difference of the second sub-pixel is greater than a surface level difference of the first sub-pixel and smaller than a surface level difference of the third sub-pixel.

19 Claims, 9 Drawing Sheets

(51) Int. Cl.
  *H10K 50/822*   (2023.01)
  *H10K 59/122*   (2023.01)
  *H10K 59/35*    (2023.01)
  *H10K 59/121*   (2023.01)
  *H10K 59/124*   (2023.01)
  *H10K 71/13*    (2023.01)
  *H10K 59/123*   (2023.01)
  *H10K 102/00*   (2023.01)

(52) U.S. Cl.
  CPC ......... *H10K 71/135* (2023.02); *H10K 59/123* (2023.02); *H10K 2102/351* (2023.02)

(56) References Cited

U.S. PATENT DOCUMENTS

| | | | | |
|---|---|---|---|---|
| 10,297,792 | B2* | 5/2019 | Park | H01L 51/56 |
| 10,439,157 | B2* | 10/2019 | Sakamoto | H01L 51/5271 |
| 10,879,327 | B2* | 12/2020 | Tanaka | H01L 27/3246 |
| 11,450,792 | B2* | 9/2022 | Koshihara | H01L 27/3241 |
| 2005/0140277 | A1* | 6/2005 | Suzuki | H01L 27/3213 |
| | | | | 313/506 |
| 2006/0244680 | A1* | 11/2006 | Vaufrey | H01L 51/5265 |
| | | | | 345/45 |
| 2006/0290274 | A1* | 12/2006 | Oota | H05B 33/22 |
| | | | | 313/506 |
| 2007/0102737 | A1* | 5/2007 | Kashiwabara | H01L 51/3206 |
| | | | | 257/291 |
| 2008/0024402 | A1* | 1/2008 | Nishikawa | H05B 33/22 |
| | | | | 345/82 |
| 2010/0258804 | A1* | 10/2010 | Tsai | H01L 51/5265 |
| | | | | 257/59 |
| 2010/0327297 | A1* | 12/2010 | Yoshida | H01L 51/5209 |
| | | | | 257/89 |
| 2011/0215305 | A1* | 9/2011 | Kim | H01L 27/3206 |
| | | | | 257/40 |
| 2012/0032207 | A1* | 2/2012 | Nishiyama | H01L 27/3258 |
| | | | | 257/89 |
| 2013/0105781 | A1* | 5/2013 | Matsushima | H10K 59/124 |
| | | | | 438/46 |
| 2013/0187132 | A1* | 7/2013 | Ando | H01L 27/3258 |
| | | | | 101/35 |
| 2014/0183460 | A1* | 7/2014 | Kim | H01L 51/56 |
| | | | | 438/34 |
| 2014/0295597 | A1* | 10/2014 | Sato | H01L 51/5271 |
| | | | | 438/29 |
| 2014/0361316 | A1* | 12/2014 | Nozawa | H01L 27/3258 |
| | | | | 438/29 |
| 2015/0060807 | A1* | 3/2015 | Koshihara | H01L 27/3211 |
| | | | | 257/40 |
| 2016/0133681 | A1* | 5/2016 | Nam | H01L 27/3258 |
| | | | | 257/40 |
| 2016/0351647 | A1* | 12/2016 | Koshihara | H01L 27/3248 |
| 2017/0194391 | A1* | 7/2017 | Xiong | H01L 27/3216 |
| 2017/0236881 | A1* | 8/2017 | Shen | H01L 51/5265 |
| | | | | 257/40 |
| 2017/0278913 | A1* | 9/2017 | Zhang | H01L 27/3258 |
| 2017/0365646 | A1* | 12/2017 | Bai | H01L 51/5203 |
| 2018/0033836 | A1* | 2/2018 | Lee | H01L 51/5265 |
| 2018/0062116 | A1* | 3/2018 | Park | H10K 50/828 |
| 2018/0138376 | A1* | 5/2018 | Koshihara | H01L 51/5265 |
| 2018/0158887 | A1* | 6/2018 | Yun | H01L 51/5209 |
| 2018/0269267 | A1* | 9/2018 | Ohchi | H01L 27/3258 |
| 2019/0097158 | A1* | 3/2019 | Sakamoto | H01L 27/3258 |
| 2019/0131355 | A1* | 5/2019 | Chae | H01L 51/5206 |
| 2019/0189701 | A1* | 6/2019 | Bang | G02F 1/133526 |
| 2019/0198816 | A1* | 6/2019 | Park | G02B 27/0176 |
| 2019/0206949 | A1* | 7/2019 | Park | H01L 27/3276 |
| 2019/0267517 | A1* | 8/2019 | Koshihara | H01L 27/322 |
| 2019/0273122 | A1* | 9/2019 | Iwasaki | H01L 51/524 |
| 2020/0013839 | A1* | 1/2020 | Tanaka | H01L 51/56 |
| 2020/0043986 | A1* | 2/2020 | Kim | H01L 51/5218 |
| 2020/0075699 | A1* | 3/2020 | Kim | H01L 27/3258 |
| 2020/0403044 | A1* | 12/2020 | Zhao | H01L 27/3216 |
| 2021/0074953 | A1* | 3/2021 | Kim | H01L 51/5271 |
| 2021/0091152 | A1* | 3/2021 | Yang | H01L 51/5218 |
| 2021/0111235 | A1* | 4/2021 | Ichikawa | H01L 51/5265 |
| 2021/0111366 | A1* | 4/2021 | Chang | H01L 27/3258 |
| 2021/0159445 | A1* | 5/2021 | Sim | H01L 27/3258 |
| 2021/0335901 | A1* | 10/2021 | Hu | H01L 51/5265 |
| 2021/0351381 | A1* | 11/2021 | Cai | H01L 25/0753 |
| 2021/0399061 | A1* | 12/2021 | Ji | H01L 27/3218 |
| 2022/0020827 | A1* | 1/2022 | Liu | H01L 51/52 |

FOREIGN PATENT DOCUMENTS

| | | | | |
|---|---|---|---|---|
| CN | 112349751 A | * | 2/2021 | ......... H01L 27/3246 |
| CN | 112786673 A | * | 5/2021 | ............ H10K 50/81 |
| CN | 114335112 A | * | 4/2022 | ............ H01L 27/32 |
| JP | 3918864 | | 5/2007 | |
| JP | 2015-19074 | | 1/2015 | |
| JP | 5648437 | | 1/2015 | |
| JP | 6164402 | | 7/2017 | |
| JP | 2018-133144 | | 8/2018 | |
| KR | 10-2020-0046196 | | 5/2020 | |
| WO | WO-2020111202 A1 | * | 6/2020 | ........... H01L 27/326 |

OTHER PUBLICATIONS

Machine translation, Shen, Chinese Pat. Pub. No. CN-112349751-A, translation date: Sep. 21, 2022, Clarivate Analytics, all pages. (Year: 2022).*

Machine translation, Watanabe, WIPO Pat. Pub. No. WO-2020111202-A1, translation date: Sep. 21, 2022, Clarivate Analytics, all pages. (Year: 2022).*

Machine translation, Zeng, Chinese Pat. Pub. No. CN 112786673-A, translation date: Apr. 26, 2023, Clarivate Analytics, all pages. (Year: 2023).*

Machine translation, Tang, Chinese Pat. Pub. No. CN 114335112-A, translation date: Apr. 26, 2023, Clarivate Analytics, all pages. (Year: 2023).*

Machine translation, Chen, Chinese Pat. Pub. No. CN 111952342-A, translation date: May 1, 2023, Espacenet, all pages. (Year: 2023).*

* cited by examiner

ORGANIC LIGHT-EMITTING DISPLAY DEVICE AND MANUFACTURING METHOD THEREOF

CROSS-REFERENCE TO RELATED APPLICATION(S)

This application claims priority to and benefits of Korean Patent Application No. 10-2020-0109102 under 35 U.S.C. § 119, filed on Aug. 28, 2020 in the Korean Intellectual Property Office (KIPO), the contents of which are herein incorporated by reference in their entirety.

BACKGROUND OF THE INVENTION

1. Technical Field

Embodiments of the disclosure relate to a light-emitting display device and a manufacturing method of the light-emitting display device. More particularly, embodiments of the disclosure relate to an organic light-emitting display device capable of suppressing or mitigating deterioration in light-emitting characteristics of each color and a manufacturing method of such organic light-emitting display device.

2. Description of the Related Art

In recent years, an organic light-emitting display (OLED) has been spotlighted as a next generation display device since it has superior brightness and viewing angle and does not necessitate a separate light source when compared to a liquid crystal display. Accordingly, the OLED has advantages of slimness and lightweight. In addition, the OLED has advantageous properties such as fast response speed, low power consumption, high brightness, etc.

The OLED generally includes an organic light-emitting element including an anode electrode, an organic light-emitting layer and a cathode electrode. Holes and electrons are injected into the organic light-emitting layer through the anode electrode and the cathode electrode, and are recombined in the organic light-emitting layer to generate excitons (electron-hole pairs). The excitons emit energy which is discharged when an excited state returns to a ground state. As a result, the organic light-emitting layer (or, the organic light-emitting element) emits light. The organic light-emitting layer is formed in various ways, such as an inkjet printing process, a nozzle printing process, etc.

Red light, green light, and blue light emitted from the organic light-emitting layer have different wavelengths from each other. To improve color reproducibility, a thickness of the organic light-emitting layer is differently set in each organic light-emitting element, and thus a resonance distance (or an optical length) between the anode electrode and the cathode electrode is adjusted.

In general, the resonance distance of an organic light-emitting element that emits red light is greater than others, and the resonance distance of an organic light-emitting element that emits blue light is smaller than others. Accordingly, an organic light-emitting layer of the organic light-emitting element emitting red light may be thicker than others, and an organic light-emitting layer of the organic light-emitting element emitting blue light may be thinner than others.

To form the organic light-emitting layer having different thicknesses in each pixel, a concentration of an organic material used to form the organic light-emitting layer or a spraying condition in which the organic material is sprayed are varied. Also, the organic light-emitting layer is formed to have different thicknesses by printing the organic material on a substrate in a repetitive manner.

In case that a surface level difference exists under the organic light-emitting layer of the OLED, the organic light-emitting layer may have an area in which its thickness decreases or increases due to the surface level difference.

SUMMARY

Embodiments of the disclosure provide an organic light-emitting display device capable of suppressing or mitigating deterioration in light-emitting characteristics of each color by preventing the thickness of the organic light-emitting layer from decreasing or increasing.

Embodiments of the invention also provide a method of manufacturing above mentioned organic light-emitting display device.

According to an embodiment, a light-emitting display device may include unit pixels, each of which may include a first sub-pixel, a second sub-pixel, and a third sub-pixel. The first sub-pixel may include a red organic light-emitting layer to emit red light and have a first surface level difference. The second sub-pixel may include a green organic light-emitting layer to emit green light and have a second surface level difference. The third sub-pixel may include a blue organic light-emitting layer to emit blue light and have a third surface level difference. The second surface level difference of the second sub-pixel may be greater than the first surface level difference of the first sub-pixel and smaller than the third surface level difference of the third sub-pixel.

In an embodiment, the first surface level difference may be about 30 nm or less, the second surface level difference may be about 40 nm or less, and the third surface level difference may be about 100 nm or less.

In an embodiment, the organic light-emitting display device may further include a planarization layer disposed under the first, second and third sub-pixels. Each of the first, second, and third surface level differences may be a surface level difference of the planarization layer corresponding to each of the first, second and third sub-pixels.

In an embodiment, the planarization layer may have a single layer.

In an embodiment, the planarization layer may include a first planarization layer and a second planarization layer formed on the first planarization layer. Each of the first, second, and third surface level differences is a surface level difference of the second planarization layer corresponding to each of the first, second, and third sub-pixels, respectively.

In an embodiment, sizes of the first sub-pixels, the second sub-pixels, and the third sub-pixels may be different from each other.

In an embodiment, an area of the second sub-pixel may be larger than an area of the first sub-pixel and smaller than an area of the third sub-pixel.

In an embodiment, shapes of the first sub-pixel, the second sub-pixel, and the third sub-pixel may be different from each other.

According to another embodiment of the disclosure, an light-emitting display device may include a substrate, a driving element, a planarization layer, a pixel defining layer, and a light-emitting element. The substrate may include a red light-emitting area, a green light-emitting area, and a blue light-emitting area. The driving element may include a first thin film transistor (TFT) formed in the red light-emitting area, a second TFT formed in the green light-emitting area, and a third TFT formed in the blue light-emitting area. The planarization layer may cover the first to third TFTs and include via holes exposing at least a part of each of drain electrodes of the first, second, and third TFTs. The light-emitting element may include pattern electrodes electrically connected to the drain electrodes through the via holes, a red organic light-emitting layer disposed on a pattern electrode corresponding to the first TFT, a green organic light-emitting layer disposed on a pattern electrode corresponding to the second TFT, a blue organic light-emitting layer disposed on a pattern electrode corresponding to the third TFT, and a common electrode covering the red organic light-emitting layer, the green organic light-emitting layer, and the blue organic light-emitting layer. The pixel defining layer may cover at least a part of each of the pattern electrodes electrically connected to the drain electrodes and at least a part of the planarization layer exposed by the pattern electrodes. A surface level difference of the planarization layer corresponding to the green organic light-emitting layer may be greater than a surface level difference of the planarization layer corresponding to the red organic light-emitting layer and smaller than a surface level difference of the planarization layer corresponding to the blue organic light-emitting layer.

In an embodiment, the surface level difference of the planarization layer corresponding to the red organic light-emitting layer may be about 30 nm or less, the surface level difference of the planarization layer corresponding to the green organic light-emitting layer may be about 40 nm or less, and the surface level difference of the planarization layer corresponding to the blue organic light-emitting layer may be about 100 nm or less.

In an embodiment, sizes of the red organic light-emitting layer, the green organic light-emitting layer, and the blue organic light-emitting layer exposed by the pixel defining layer may be different from each other.

In an embodiment, the light-emitting display device may further include a red sub-pixel corresponding to the red light-emitting area, a green sub-pixel corresponding to the green light-emitting area, and a blue sub-pixel corresponding to the blue light-emitting area. An area of the green sub-pixel exposed by the pixel defining layer may be larger than an area of the red sub-pixel exposed by the pixel defining layer, and may be smaller than an area of the blue sub-pixel exposed by the pixel defining layer.

In an embodiment, shapes of the red sub-pixel, the green sub-pixel, and the blue sub-pixel may be different from each other.

According to another embodiment of the disclosure, there is provided a method of manufacturing a light-emitting display device. In the method, a first thin film transistor (TFT), a second TFT, and a third TFT may be formed in a red light-emitting area, a green light-emitting area, and a blue light-emitting area on a substrate, respectively. A planarization layer covering the first to third TFTs and including via holes exposing at least a part of each of drain electrodes of the first to third TFTs may be formed. Pattern electrodes electrically connected to the drain electrodes through the via holes may be formed. A pixel defining layer covering at least a part of each of the pattern electrodes and at least a part of the planarization layer exposed by the pattern electrodes may be formed. A red organic light-emitting layer, a green organic light-emitting layer, and a blue organic light-emitting layer may be formed on a pattern electrode corresponding to the first TFT, a pattern electrode corresponding to the second TFT, and a pattern electrode corresponding to the third TFT, respectively. A common electrode covering the pixel defining layer and the organic light-emitting layer may be formed. A surface level difference of the planarization layer corresponding to the green organic light-emitting layer may be greater than a surface level difference of the planarization layer corresponding to the red organic light-emitting layer and smaller than a surface level difference of the planarization layer corresponding to the blue organic light-emitting layer.

In an embodiment, the surface level difference of the planarization layer corresponding to the red organic light-emitting layer may be about 30 nm or less, the surface level difference of the planarization layer corresponding to the green organic light-emitting layer may be about 40 nm or less, and the surface level difference of the planarization layer corresponding to the blue organic light-emitting layer may be about 100 nm or less.

In an embodiment, an area of the green organic light-emitting layer exposed by the pixel defining layer may be larger than an area of the red organic light-emitting layer exposed by the pixel defining layer and smaller than an area of the blue organic light-emitting layer exposed by the pixel defining layer.

In an embodiment, the red organic light-emitting layer, the green organic light-emitting layer, and the blue organic light-emitting layer may be formed by an inkjet printing process.

According to another embodiment of the disclosure, there is provided a method of manufacturing a light-emitting display device. In the method, a first thin film transistor (TFT), a second TFT, and a third TFT may be formed in a first light-emitting area, a second, and a third light-emitting areas on a substrate, respectively. A first planarization layer covering the first to third TFTs and including first via holes exposing at least a part of each of drain electrodes of the first to third TFTs may be formed. Contact metals electrically connected to the drain electrodes through the first via holes may be formed. A second planarization layer covering at least a part of each of the contact metals and at least a part of the first planarization layer and including second via holes exposing at least a part of each of the contact metals may be formed. Pattern electrodes electrically connected to the contact metals through the second via holes may be formed. A pixel defining layer may be formed on the second planarization layer to expose the pattern electrodes through openings formed to define pixels. A red organic light-emitting layer, a green organic light-emitting layer, and a blue organic light-emitting layer may be formed on a pattern electrode corresponding to the first TFT, a pattern electrode corresponding to the second TFT, and a pattern electrode corresponding to the third TFT, respectively. A surface level difference of the second planarization layer corresponding to the green organic light-emitting layer is greater than a surface level difference of the second planarization layer corresponding to the red organic light-emitting layer and smaller than a surface level difference of the second planarization layer corresponding to the blue organic light-emitting layer.

In an embodiment, the surface level difference of the planarization layer corresponding to the red organic light-emitting layer may be about 30 nm or less, the surface level difference of the planarization layer corresponding to the green organic light-emitting layer may be about 40 nm or less, and the surface level difference of the planarization layer corresponding to the blue organic light-emitting layer may be about 100 nm or less.

In an embodiment, the red organic light-emitting layer, the green organic light-emitting layer, and the blue organic light-emitting layer may be formed by an inkjet printing process.

According to the embodiments of an organic light-emitting display device and a manufacturing method of the organic light-emitting display device, since each color sub-pixel has a different level of allowable surface level difference, it is possible to prevent deterioration of the light-emitting characteristics of each color by designing a different level of surface level of each color sub-pixel in consideration of the allowable flatness of each color sub-pixel. It is also possible to suppress or mitigate deterioration of the light-emitting characteristics of each color by separately designing the shape of each color sub-pixel in consideration of the allowable flatness of each color sub-pixel without a special planarization process.

BRIEF DESCRIPTION OF THE DRAWINGS

The above and other features and aspects of the embodiments will become more apparent by describing in detail the embodiments with reference to the accompanying drawings, in which.

DETAILED DESCRIPTION OF THE EMBODIMENTS

Figure 1:
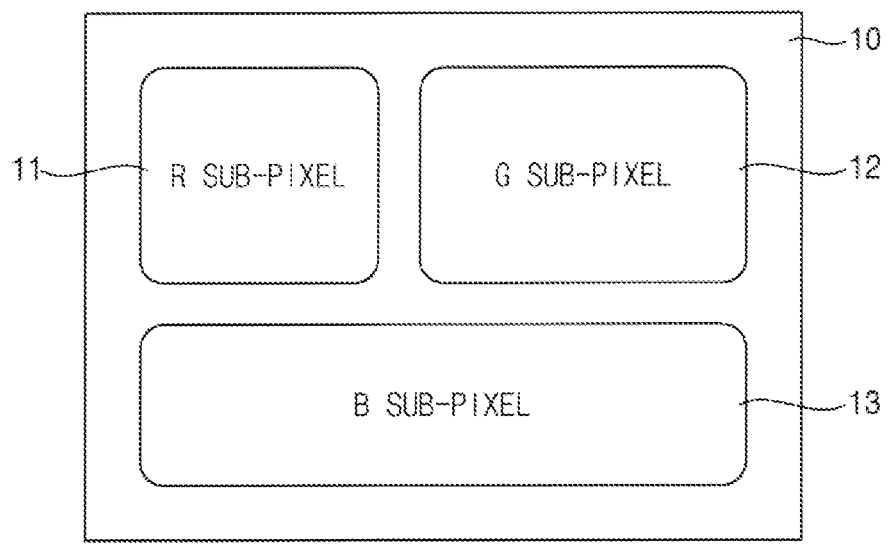
FIG. 1 is a plan view schematically illustrating an arrangement structure of unit pixels included in an organic light-emitting display device according to an embodiment.

Hereinafter, an organic light-emitting display device and a method of manufacturing the same according to embodiments of the disclosure will be described in detail with reference to the accompanying drawings. In the accompanying drawings, the same or similar reference numerals are used for substantially the same or similar components.

FIG. 1 is a plan view schematically illustrating an arrangement structure of unit pixels included in an organic light-emitting display device according to an embodiment.

Referring to FIG. 1, an organic light-emitting display device has a structure in which unit pixels 10 are repeatedly arranged on a substrate in a row direction and a column direction.

Each of the unit pixels 10 may include a red sub-pixel 11 including an organic light-emitting layer (i.e., a red organic light-emitting layer) emitting red light, a green sub-pixel 12 including an organic light-emitting layer (i.e., a green organic light-emitting layer) emitting green light, and a blue sub-pixel 13 including an organic light-emitting layer (i.e., a blue organic light-emitting layer) emitting blue light. The red organic light-emitting layer, the green organic light-emitting layer and the blue organic light-emitting layer may be formed by using a technique such as an inkjet printing process.

A surface level difference of the green sub-pixel 12 may be set to be greater than a surface level difference of the red sub-pixel 11 and smaller than a surface level difference of the blue sub-pixel 13. For example, the surface level difference of the red sub-pixel 11 may be set to be about 30 nm or less, the surface level difference of the green sub-pixel 12 may be set to be about 40 nm or less, and the surface level difference of the blue sub-pixel 13 may be set to about 100 nm or less.

The red sub-pixel 11, the green sub-pixel 12 and the blue sub-pixel 13 may have different sizes from each other. For example, the size of the green sub-pixel 12 may be larger than the size of the red sub-pixel 11 and smaller than the size of the blue sub-pixel 13.

The red sub-pixel 11, the green sub-pixel 12 and the blue sub-pixel 13 may have different shapes from each other when viewed in a plan view. For example, when the red sub-pixel 11 has a rectangular shape with rounded corners, the green sub-pixel 12 and the blue sub-pixel 13 may have a rounded pentagonal shape and a circular shape, respectively. For example, when the red sub-pixel 11 has a rounded oval shape, the green sub-pixel 12 and the blue sub-pixel 13 may have a circular shape and a rectangular shape with rounded corners, respectively.

Figure 2:
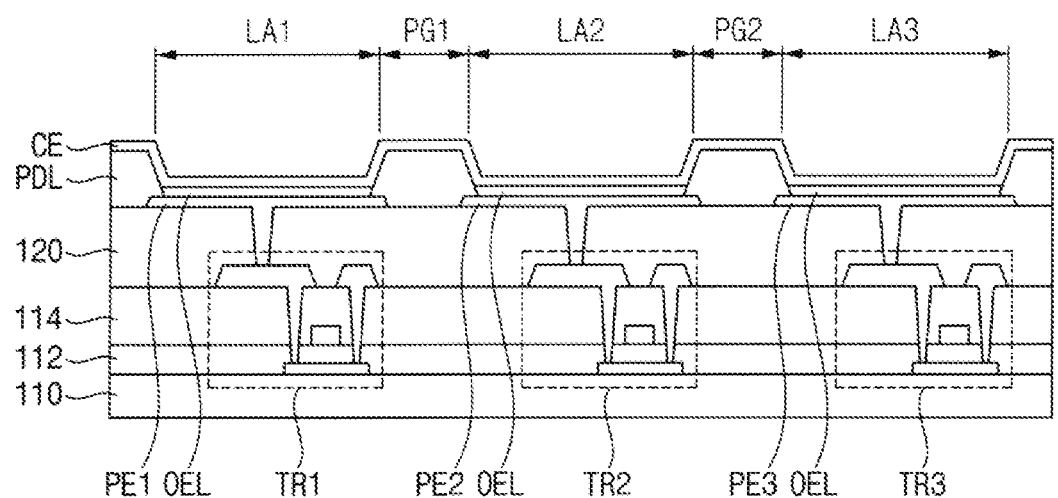
FIG. 2 is a schematic cross-sectional view illustrating an organic light-emitting display device according to an embodiment.

FIG. 2 is a schematic cross-sectional view illustrating an organic light-emitting display device according to an embodiment.

Referring to FIG. 2, an organic light-emitting display device may include a display area that generates light to display an image. The display area includes light-emitting areas that emit light of different colors. For example, the organic light-emitting display device may include a first light-emitting area LA1 emitting first color light, a second light-emitting area LA2 emitting second color light, and a third light-emitting area LA3 emitting third color light. In an embodiment, the first light-emitting area LA1 may emit red light, the second light-emitting area LA2 may emit green light, and the third light-emitting area LA3 may emit blue light.

In an embodiment, each of the light-emitting areas LA1, LA2 and LA3 may have a rectangular shape with rounded corners. However, the shapes of the light-emitting areas LA1, LA2 and LA3 are not limited thereto. The light-emitting areas LA1, LA2 and LA3 may have different shapes. For example, the light-emitting areas LA1, LA2 and LA3 may have various shapes such as a square, a rectangle, a rhombus, a triangle, a hexagon, a circle and the like. Edges or corners of each of the light-emitting areas LA1, LA2 and LA3 may have a round shape.

In an embodiment, the light-emitting areas LA1, LA2 and LA3 may have different sizes from each other. For example, the second light-emitting area LA2 emitting green light may have an area smaller than the first light-emitting area LA1 emitting red light and the third light-emitting area LA3 emitting blue light. However, the sizes of the areas are not limited thereto. For example, the first light-emitting area LA1 or the third light-emitting area LA3 may have a smaller area than the other light-emitting areas. In another example, the sizes of the light-emitting areas may be substantially same.

The organic light-emitting display device includes a light-emitting element generating light according to an applied electric signal or power and a driving element electrically connected to the light-emitting element. Lights generated by the light-emitting element are emitted to an outside through a corresponding light-emitting area. In an embodiment, the light-emitting element may include an organic light-emitting diode.

The driving element and the light-emitting element may be disposed on a base substrate 110. For example, the driving element may include a first thin film transistor TR1, a second thin film transistor TR2 and a third thin film transistor TR3. In FIG. 2, reference numeral 112 denotes a gate insulating layer, and reference numeral 114 denotes a data insulating layer.

The first to third thin film transistors TR1, TR2 and TR3 may be covered by a planarization layer 120. The planarization layer 120 may include an inorganic insulating layer, an organic insulating layer, or a combination thereof.

In an embodiment, in order to improve a reduction in the light-emitting characteristics of each color, the surface level difference of the planarization layer 120 may be adjusted for each color sub-pixel, that is, for each light-emitting area. The surface level difference of the planarization layer 120 means a difference between the minimum and maximum levels or heights of the surface of the planarization layer 120. A surface level difference of the planarization layer 120 corresponding to a green sub-pixel may be adjusted to be greater than a surface level difference of the planarization layer 120 corresponding to a red sub-pixel, and may be adjusted to be smaller than a surface level difference of the planarization layer 120 corresponding to a blue sub-pixel. For example, the surface level difference of the planarization layer 120 corresponding to the red sub-pixel may be about 30 nm or less, the surface level difference of the planarization layer 120 corresponding to the green sub-pixel may be about 40 nm or less, and the surface level difference of the planarization layer 120 corresponding to the blue sub-pixel may be about 100 nm or less.

The organic light-emitting layer of the blue sub-pixel (or blue organic light-emitting layer) may have a printed thickness thinner than the organic light-emitting layer of the green sub-pixel (or green organic light-emitting layer) or the organic light-emitting layer of the red sub-pixel (or red organic light-emitting layer), so that it may be difficult to decrease a surface level difference of a layer under the blue organic light-emitting layer. In contrast, the green organic light-emitting layer or the red organic light-emitting layer may have a printed thickness thicker than the blue organic light-emitting layer, so that a planarization effect may occur before flow, and the thickness change may occur after flow.

For example, after the printed blue organic light-emitting layer flows, a thickness of the blue organic light-emitting layer corresponding to an area where the wiring is formed and a thickness of the blue organic light-emitting layer corresponding to an area where the wiring is not formed may be uniform. In contrast, after the printed green or red organic light-emitting layer flows, the organic light-emitting layer corresponding to an area where the wiring is formed and the organic light-emitting layer corresponding to an area where the wiring is not formed may have different thicknesses due to the planarization effect.

However, according to the embodiment, the surface level difference of the planarization layer formed under the organic light-emitting layer may be adjusted to an allowable surface level difference for each color sub-pixel. Thus, when the organic light-emitting layer for each color sub-pixel is printed, the thickness of the organic light-emitting layer for each color sub-pixel may be uniformly maintained.

The thin film transistors TR1, TR2 and TR3 may be electrically connected to corresponding light-emitting elements. For example, the light-emitting element includes an anode, an organic light-emitting layer and a cathode. The light-emitting element may generate lights by receiving power according to an operation of the driving element.

In an embodiment, the light-emitting element may include pattern electrodes electrically connected to the thin film transistors TR1 TR2 and TR3. For example, the pattern electrodes may operate as an anode of the organic light-emitting diode.

For example, the organic light-emitting display device may include a first pattern electrode PE1 electrically connected to the first thin film transistor TR1, a second pattern electrode PE2 electrically connected to the second thin film transistor TR2, and a third pattern electrode PE3 electrically connected to the third thin film transistor TR3. The first to third pattern electrodes PE1, PE2, and PE3 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), Lithium (Li), calcium (Ca), molybdenum (Mo), titanium (Ti), tungsten (W) and copper (Cu). The first to third pattern electrodes PE1, PE2, and PE3 may include a multi-layered metal layer. In one embodiment, the first to third pattern electrodes PE1, PE2, and PE3 may have a three-layered structure (Ti/Al/Ti) in which titanium (Ti) is formed above and below aluminum (Al). However, the structure of the first to third pattern electrodes PE1, PE2 and PE3 is not limited thereto, and the first to third pattern electrodes PE1, PE2 and PE3 may be formed to have various materials and various layers.

An organic light-emitting layer OEL may be disposed on the first to third pattern electrodes PE1, PE2 and PE3. The organic light-emitting layer OEL may be formed to have a different thickness for each color by a method such as an inkjet printing process or a nozzle printing process. For example, an organic light-emitting layer emitting red light may be formed first, an organic light-emitting layer emitting green light may be formed, and then an organic light-emitting layer emitting blue light may be formed.

A common electrode CE is disposed on the organic light-emitting layer OEL. The common electrode CE may serve as a cathode.

A pixel defining layer PDL may be disposed on the planarization layer 120. The pixel defining layer PDL may have an opening overlapping the pattern electrodes PE1, PE2 and PE3. The shape and size of the light-emitting areas LA1, LA2 and LA3 may be defined by the opening.

In an embodiment, the organic light-emitting layer OEL may be formed by stacking one or more layers of an emissive layer (EML) and a functional layer in a single or complex structure. The functional layer may include a hole transport layer (HTL), a hole injection layer (HIL), an electron transport layer (ETL), an electron injection layer (EIL), and the like.

In an embodiment, the hole transport layer, the light-emitting layer and the electron transport layer may be formed as a common layer continuously extending within the organic light-emitting layer OEL. For example, the organic light-emitting layer OEL in the first light-emitting area LA1 may include the hole transport layer, a light-emitting layer emitting red light and the electron transport layer. In the second light-emitting area LA2, the organic light-emitting layer OEL may include the hole transport layer, a light-emitting layer emitting green light and the electron transport layer. In the third light-emitting area LA3, the organic light-emitting layer OEL may include the hole transport layer, a light-emitting layer emitting blue light and the electron transport layer.

The thickness of the organic light-emitting layer OEL may be determined according to the resonance thickness of light emitted from each light-emitting area. The resonance thickness may indicate a thickness at which light resonance occurs. Light generated by the organic light-emitting layer OEL may be resonated between electrodes including a material having a high reflectivity. For example, light generated by the organic light-emitting layer OEL may resonate between the pattern electrodes PE1, PE2 and PE3 and the common electrode CE.

The resonance thickness varies depending on the wavelength of light. Therefore, when the distance between the pattern electrodes PE1, PE2 and PE3 and the common electrode CE in each light-emitting area may be substantially equal to or close to the resonance thickness of light emitted in each light-emitting area, light having a specific wavelength may be emitted or the intensity of light-emitting may be increased. For example, the sum of the thicknesses of the hole transport layer, the light-emitting layer and the electron transport layer may be adjusted to be substantially equal to the resonance thickness of green light emitted from the second light-emitting area LA2.

The resonance thickness may vary depending on not only the wavelength of light, but also the shape of the resonance. In an embodiment, a thickness of the organic light-emitting layer OEL in the second light-emitting area LA2 may be determined to approximate a primary resonance thickness of green light, and a thickness of the organic light-emitting layer OEL in the third light-emitting area LA3 may be determined to approximate a secondary resonance thickness of blue light.

In an embodiment, the pattern electrodes PE1, PE2 and PE3 may have a multi-layered structure of a transparent conductive material and a metal having a high reflectivity. For example, each of the pattern electrodes PE1, PE2 and PE3 may include a reflective layer (not shown) including a metal such as silver (Ag) and an upper transmission conductive layer (not shown) disposed on the reflective layer and including a transparent conductive material. A lower transmission conductive layer (not shown) may be disposed under the reflective layer. A thickness of the organic light-emitting layer OEL may be determined so that a distance between the common electrode CE and the reflective layer is substantially equal to or approximates a resonance thickness of light emitted from each light-emitting area.

In an embodiment, a capping layer (not shown) may be disposed on the common electrode CE. The capping layer may protect the light-emitting element and increase extraction efficiency of light generated by the organic light-emitting diode.

In an embodiment, an encapsulation layer (not shown) may be disposed on the capping layer. For example, the encapsulation layer may have a multi-layered structure of an organic thin film and an inorganic thin film.

In an embodiment, when the pattern of the organic light-emitting layer OEL is disposed in the light-emitting areas LA1, LA2 and LA3, in order to prevent overlap due to a process error, it is necessary to properly maintain pixel intervals PG1 and PG2, and it is necessary to maintain the pixel intervals PG1 and PG2 in an approximate range. However, according to the embodiment, overlapping of patterns does not occur. Accordingly, an aperture ratio may be increased by decreasing a pixel gap, and a light-emitting area may be variously formed.

FIGS. 3A to 3F are schematic cross-sectional views illustrating a method of manufacturing the organic light-emitting display device illustrated in FIG. 2.

Figure 3A:
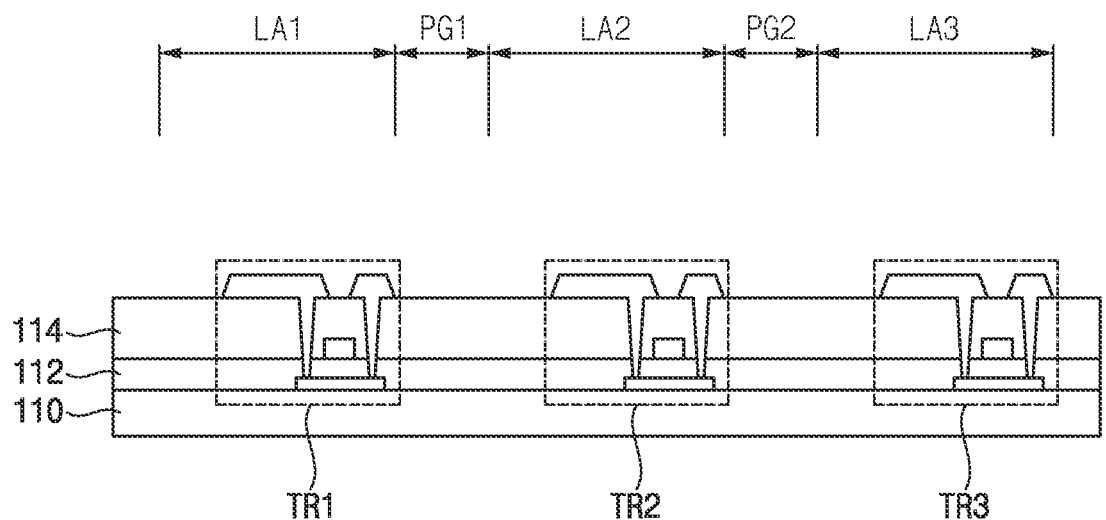
FIGS. 3A to 3F are schematic cross-sectional views illustrating a method of manufacturing the organic light-emitting display device illustrated in FIG. 2.

Referring to FIG. 3A, after partially forming an active layer in each of the first light-emitting area LA1, the second light-emitting area LA2 and the third light-emitting area LA3 of the substrate 110, the gate insulating layer 112 may be formed entirely to cover the active layer. After forming a gate wiring and a gate electrode, a data insulating layer 114 may be formed. A first contact hole may be formed in a portion of the data insulating layer 114 and the gate insulating layer 112 to expose a portion of the active layer, and a second contact hole may be formed to expose another portion of the active layer. A source electrode electrically connected to the active layer through the first contact hole and a drain electrode electrically connected to the active layer through the second contact hole may be formed. Through this process, a first thin film transistor TR1, a second thin film transistor TR2 and a third thin film transistor TR3 may be formed in each of the first light-emitting area LA1, the second light-emitting area LA2, and the third light-emitting area LA3.

Figure 3B:
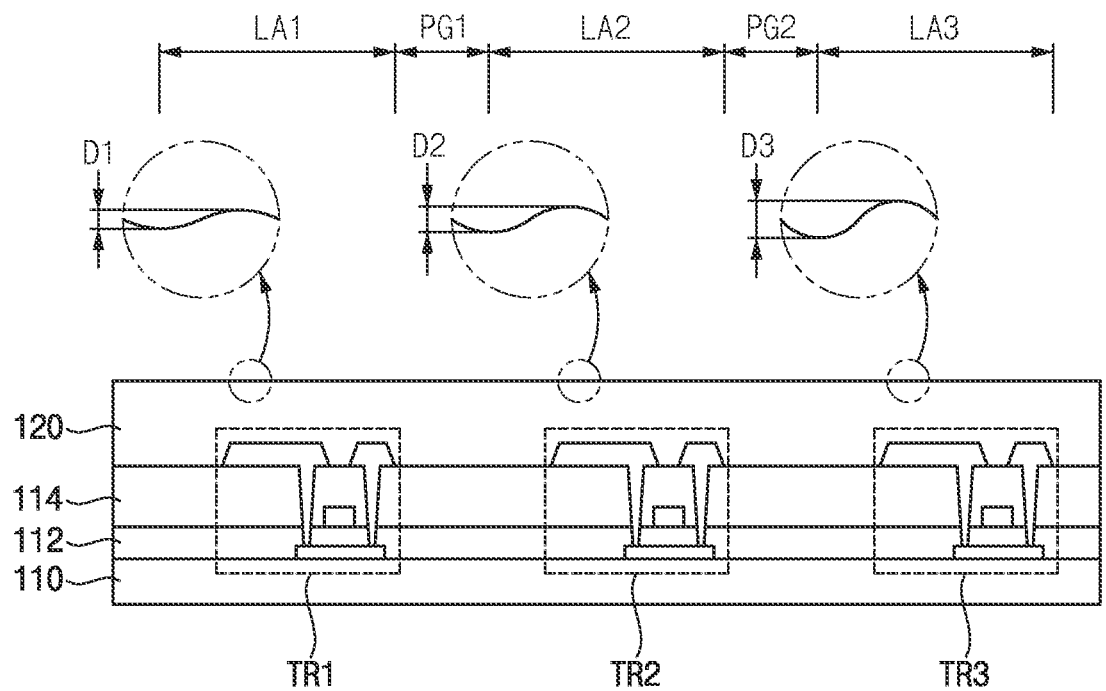

Referring to FIG. 3B, a planarization layer 120 may be formed to cover the first to third thin film transistors TR1, TR2 and TR3 and the data insulating layer 114. The planarization layer 120 may include one or more materials selected from the group consisting of polyimide, polyamide, acrylic resin, benzocyclobutene, and phenol resin. For example, a composition containing a binder resin may be applied (or formed) on the data insulating film 114. The binder resin may include a high heat-resistant acrylic resin, a phenol resin, and the like. The composition may be applied (or formed) by spin coating. The composition may be cured by heating or irradiation with ultraviolet rays to form the planarization layer 120. The planarization layer 120 may have a sufficient thickness to planarize the upper surface of the substrate 110 having the gate insulating layer 112 and the data insulating layer 114 formed thereon. In order to prevent defects such as disconnection or short circuit of the connection wiring that may be formed on the planarization layer 120, the planarization layer 120 may serve to eliminate and planarize a surface level difference. For example, the planarization layer 120 corresponding to the first light-emitting area LA1 may be formed to have a surface level difference of about 30 nm or less, the planarization layer 120 corresponding to the second light-emitting area LA2 may be formed to have a surface level difference of about 40 nm or less, and the planarization layer 120 corresponding to the third light-emitting area LA3 may be formed to have a surface level difference of about 100 nm or less. A first, second, and third surface level difference of various portions of the planarization layer 120 is shown in FIG. 3B (as D1, D2, and D3, respectively) for each of the light-emitting areas LA1, LA2 and LA3.

Figure 3C:
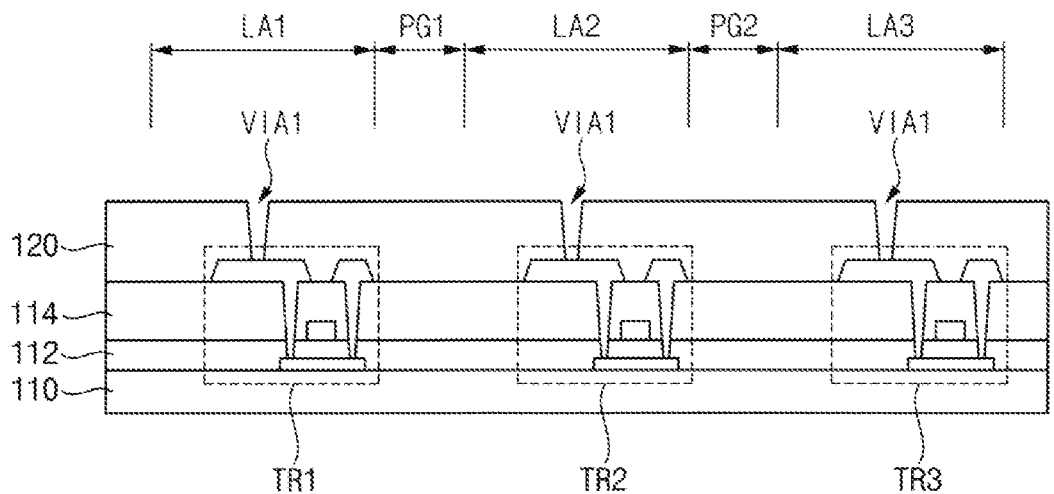

Referring to FIG. 3C, via holes VIA1 exposing a portion of a drain electrode of each of the first to third thin film transistors TR1, TR2 and TR3 are formed.

Figure 3D:
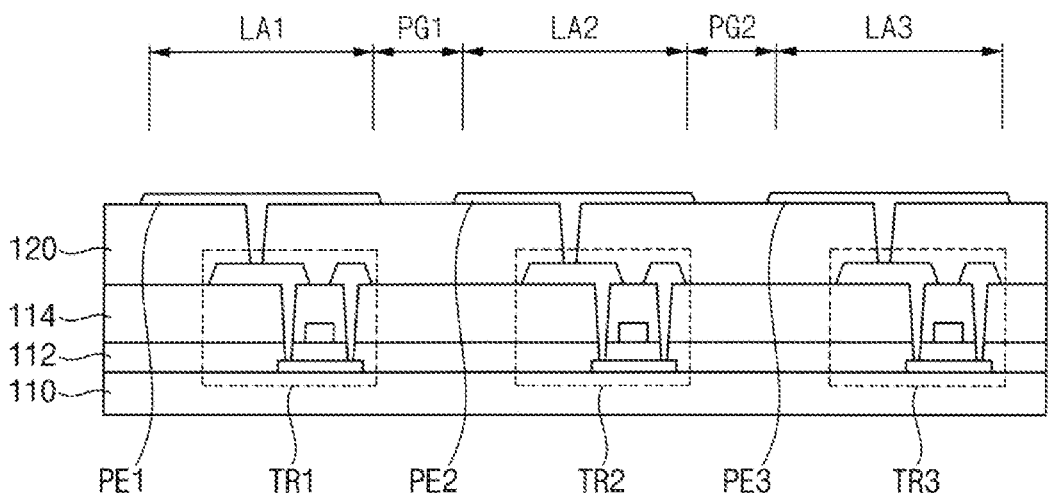

Referring to FIG. 3D, pattern electrodes PE1, PE2 and PE3 may be formed on the planarization layer 120 in which the via holes VIA1 are formed, and be electrically connected to the drain electrodes through the via holes VIAL For example, a conductive layer may be formed on the planarization layer 120 in which the via holes VIA1 are formed. The conductive layer may include a highly conductive metal material used as an electrode material. The conductive layer may include an alloy containing materials such as Al, Ti, Mo, Ag, Cr and the like. The conductive layer may be patterned to have a conductive pattern by a photo process using a photo mask (not shown). The photo process may be applied to a general photo lithography process. For example, a photoresist film (not shown) may be formed on the conductive layer and exposed through a photo mask (not shown). Subsequently, the conductive layer may be patterned to form the conductive pattern through development and etching processes, and the photoresist film remaining on the conductive layer is removed. The conductive pattern corresponds to the pattern electrodes PE1, PE2 and PE3 electrically connected to each of the drain electrodes through via holes VIA1.

Figure 3E:
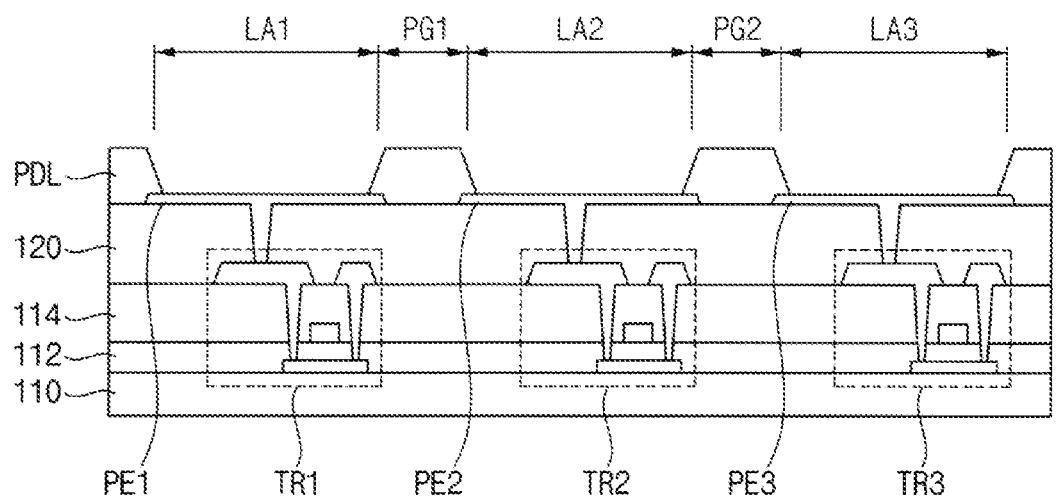

Referring to FIG. 3E, a pixel defining layer PDL may be formed on the planarization layer 120. The pixel defining layer PDL may expose the pattern electrodes PE1, PE2 and PE3 through openings formed to define pixels. For example, a photoresist composition including phenol resin, acrylic resin, polyimide resin, polyamide resin, siloxane resin, epoxy resin, etc. may be coated on the planarization layer 120, and the coated photoresist composition may be exposed and developed to form the pixel defining layer PDL having the openings.

Figure 3F:
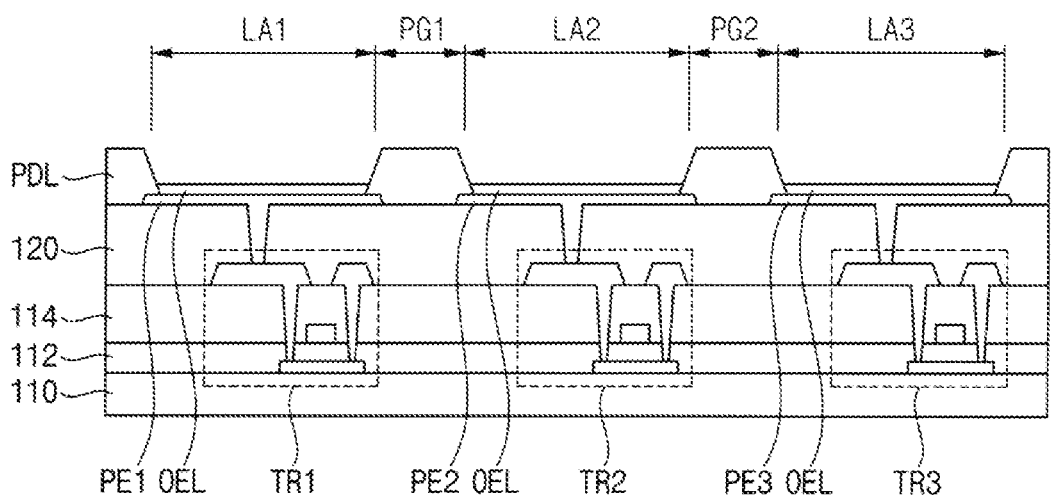

Referring to FIG. 3F, organic light-emitting layers OEL may be formed by using a method such as an inkjet printing process or a nozzle printing process on the pattern electrodes PE1, PE2 and PE3 exposed by the pixel defining layer PDL. In an embodiment, the organic light-emitting layer OEL may be formed by stacking one or more layers of an emissive layer (EML) and a functional layer in a single or complex structure. The functional layer may include a hole transport layer (HTL), a hole injection layer (HIL), an electron transport layer (ETL), an electron injection layer (EIL), and the like. The organic light-emitting layers OEL may include a low molecular weight or high molecular weight organic material. When the organic light-emitting layers OEL emit red, green and blue light, respectively, the organic light-emitting layer OEL may include a red organic light-emitting layer, a green organic light-emitting layer, and a blue organic light-emitting layer. When the organic light-emitting layers OEL emit white light, the organic light-emitting layers OEL may have a multi-layered structure in which a red organic light-emitting layer, a green organic light-emitting layer and a blue organic light-emitting layer are stacked so as to emit white light. In other embodiments, when the organic light-emitting layers OEL emit white light, the organic light-emitting layers OEL may have a single layer structure including a red light-emitting material, a green light-emitting material and a blue light-emitting material.

In an embodiment, the organic light-emitting layers OEL may be formed through an inkjet printing process. The inkjet printing process is a process of discharging a liquid material along a pattern in several to tens of pico droplets along a pattern using fine nozzles and drying the discharged liquid material to form a pattern layer. Since the inkjet printing process does not require a separate mask, the process cost may be low and it may be advantageous for a large area.

Thereafter, a common electrode CE (see FIG. 2) may be formed on the pixel defining layer PDL and the organic light-emitting layers OEL to manufacture an organic light-emitting display device as illustrated in FIG. 2. Accordingly, as the pattern electrodes PE1, PE2 and PE3, the organic light-emitting layer OEL and the common electrode CE may be formed, an organic light-emitting diode (OLED) as a light-emitting device may be formed.

Figure 4:
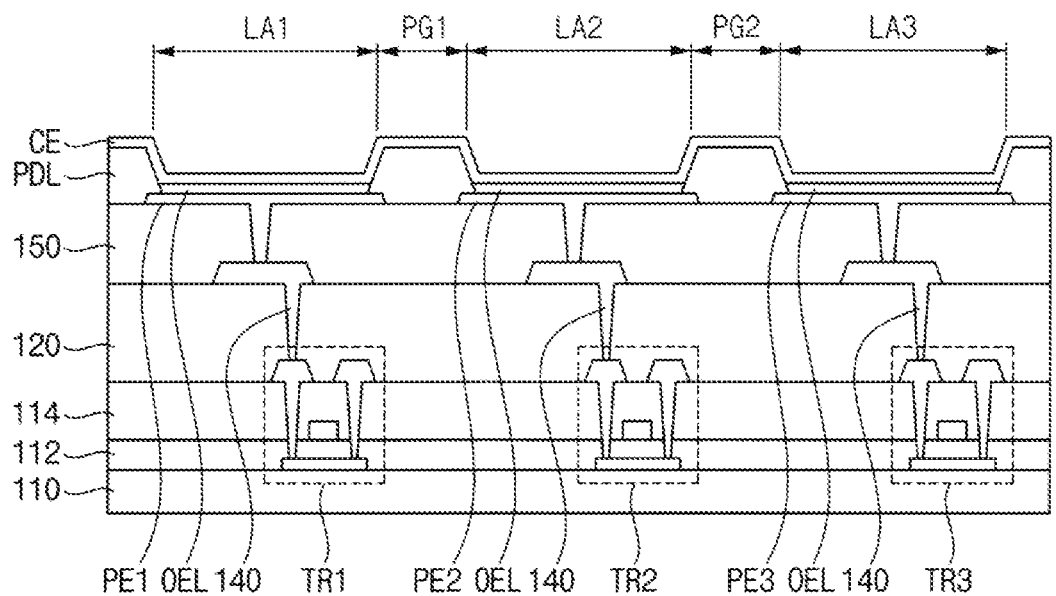
FIG. 4 is a schematic cross-sectional view illustrating an organic light-emitting display device according to another embodiment.

FIG. 4 is a schematic cross-sectional view illustrating an organic light-emitting display device according to another embodiment.

Referring to FIG. 4, an organic light-emitting display device may include a display area generating light to display an image. The display area may include light-emitting areas emitting light of different colors. For example, the organic light-emitting display device may include a first light-emitting area LA1 emitting first color light, a second light-emitting area LA2 emitting second color light, and a third light-emitting area LA3 emitting third color light. The first to third light-emitting areas LA1, LA2 and LA3 may be substantially the same as the first to third light-emitting areas LA1, LA2 and LA3 described in FIG. 2. Thus, the same reference numeral will be used to refer to substantially the same or similar parts as those described in FIG. 2 and detailed descriptions thereof will be omitted.

The organic light-emitting display device may include a light-emitting element generating light according to an applied electric signal or power and a driving element electrically connected to the light-emitting element. For example, the driving element may include a first thin film transistor TR1, a second thin film transistor TR2 and a third thin film transistor TR3. The first to third thin film transistors TR1, TR2 and TR3 may be substantially the same as the driving elements described in FIG. 2. Thus, the same reference numeral will be used to refer to the same or similar parts as those described in FIG. 2 and detailed descriptions thereof will be omitted.

The first to third thin film transistors TR1, TR2 and TR3 may be covered by the first planarization layer 120. The first planarization layer 120 may include an inorganic insulating layer, an organic insulating layer, or a combination thereof.

Contact metals 140 may be formed on the first planarization layer 120 to correspond to each of the first to third light-emitting areas LA1, LA2 and LA3. The contact metals 140 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), Lithium (Li), calcium (Ca), molybdenum (Mo), titanium (Ti), tungsten (W) and copper (Cu). The contact metals 140 may include a multi-layered metal layer. In one embodiment, the contact metals 140 may have a three-layered structure (Ti/Al/Ti) in which titanium (Ti) is formed above and below aluminum (Al). However, the structure of the first to third pattern electrodes PE1, PE2, and PE3 is not limited thereto, and the contact metals 140 may be formed to have various materials and various layers.

Each of the contact metals 140 may be electrically connected to a drain electrode of the first to third thin film transistors TR1, TR2 and TR3 through first via holes formed in the first planarization layer 120.

A second planarization layer 150 may be formed on the first planarization layer 120 on which the contact metals 140 are formed. In an embodiment, in order to improve a reduction in light-emitting characteristics of each color, the surface level difference of the second planarization layer 150 may be adjusted for each color sub-pixel, that is, for each light-emitting area. A surface level difference of the second planarization layer 150 corresponding to the green sub-pixel may be adjusted to be greater than a surface level difference of the red sub-pixel and smaller than the surface level difference of the second planarization layer 150 corresponding to the blue sub-pixel. For example, a surface level difference of the second planarization layer 150 corresponding to the red sub-pixel may be about 30 nm or less, a surface level difference of the second planarization layer 150 corresponding to the green sub-pixel may be about 40 nm or less, and a surface level difference of the second planarization layer 150 corresponding to the blue sub-pixel may be about 100 nm or less.

The organic light-emitting layer (or blue organic light-emitting layer) of the blue sub-pixel may have a printed thickness thinner than the organic light-emitting layer (or green organic light-emitting layer) of the green sub-pixel or the organic light-emitting layer (or red organic light-emitting layer) of the red sub-pixel, so that it may be difficult to decrease a surface level difference of a layer under the blue organic light-emitting layer. In contrast, the green organic light-emitting layer or the red organic light-emitting layer may have a printed thickness thicker than the blue organic light-emitting layer, so that a planarization effect may occur before flow, and the thickness may change after flow.

For example, after the printed blue organic light-emitting layer flows, a thickness of the blue organic light-emitting layer corresponding to an area where a wiring is formed and a thickness of the blue organic light-emitting layer corresponding to an area where a wiring is not formed may be uniform. In contrast, after the printed green or red organic light-emitting layer flows, the organic light-emitting layer corresponding to an area where a wiring is formed and the organic light-emitting layer corresponding to an area where a wiring is not formed may have different thicknesses due to the planarization effect.

However, according to the embodiment, the surface level difference of the second planarization layer 150 formed under the organic light-emitting layer is adjusted to an allowable surface level difference for each color sub-pixel. Accordingly, when the organic light-emitting layer for each color sub-pixel is printed, the thickness of the organic light-emitting layer for each color sub-pixel may be uniformly maintained.

The thin film transistors TR1, TR2 and TR3 may be electrically connected to the light-emitting element through corresponding contact metals 140. For example, the light-emitting element includes an anode, an organic light-emitting layer, and a cathode. The light-emitting element may generate light by receiving power according to an operation of the driving element.

In an embodiment, the light-emitting element may include a pattern electrode electrically connected to the thin film transistors TR1, TR2 and TR3. For example, the pattern electrode may serve as an anode of an organic light-emitting diode.

For example, the organic light-emitting display device may include a first pattern electrode PE1 electrically connected to the first thin film transistor TR1, a second pattern electrode PE2 electrically connected to the second thin film transistor TR2, and a third pattern electrode PE3 electrically connected to the third thin film transistor TR3.

An organic light-emitting layer OEL may be disposed on the pattern electrodes PE1, PE2 and PE3. A common electrode CE may be disposed on the organic light-emitting layer OEL. The common electrode CE may serve as a cathode.

A pixel defining layer PDL may be disposed on the second planarization layer 150. The pixel defining layer PDL may be substantially the same as the pixel defining layer PDL described in FIG. 2. Thus, the same reference numeral will be used to refer to substantially the same or like parts as those described in FIG. 2 and detailed descriptions thereof may be omitted.

A capping layer (not shown) and an encapsulation layer (not shown) may be sequentially disposed on the common electrode CE.

FIGS. 5A to 5I are schematic cross-sectional views illustrating a method of manufacturing the organic light-emitting display device illustrated in FIG. 4.

Figure 5A:
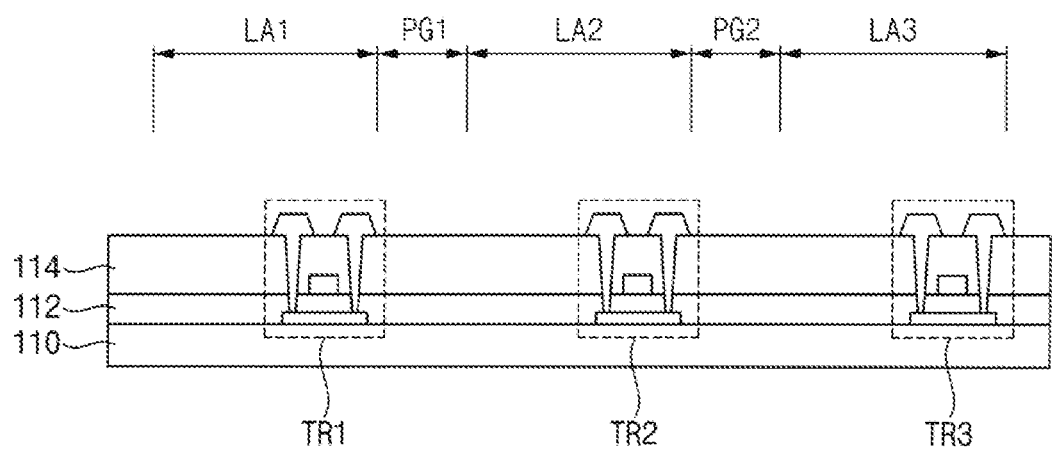
FIGS. 5A to 5I are schematic cross-sectional views illustrating a method of manufacturing the organic light-emitting display device illustrated in FIG. 4.

Referring to FIG. 5A, after partially forming an active layer in each of the first light-emitting area LA1, the second light-emitting area LA2 and the third light-emitting area LA3 of the substrate 110, the gate insulating layer 112 may be formed as a whole. After forming a gate wiring and a gate electrode, a data insulating layer 114 may be formed. A first contact hole may be formed in a portion of the data insulating layer 114 and the gate insulating layer 112 to expose a portion of the active layer, and a second contact hole may be formed to expose another portion of the active layer. A source electrode electrically connected to the active layer through the first contact hole and a drain electrode electrically connected to the active layer through the second contact hole may be formed. Through this process, the first thin film transistor TR1, the second thin film transistor TR2 and the third thin film transistor TR3 may be formed in the first light-emitting area LA1, the second light-emitting area LA2 and the third light-emitting area LA3, respectively.

Figure 5B:
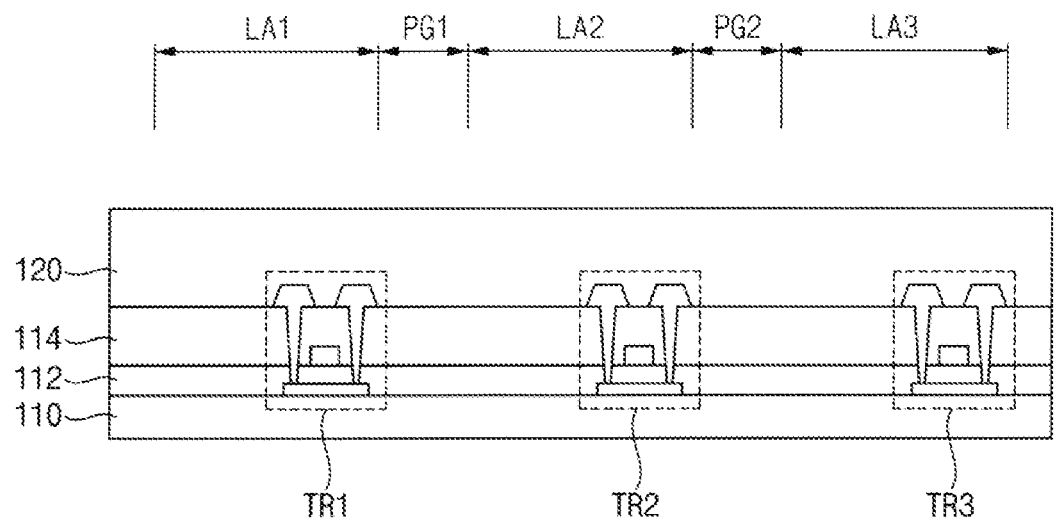

Referring to FIG. 5B, a first planarization layer 120 may be formed on the first to third thin film transistors TR1, TR2 and TR3. For example, a composition containing a binder resin may be applied (or formed) on the data insulating film. For example, the binder resin may include an acrylic resin, a phenol resin, and the like, which have a high heat-resistance. The composition may be formed by spin coating. The composition may be cured by heating or irradiation of ultraviolet rays to form the first planarization layer 120. The first planarization layer 120 may have a sufficient thickness to planarize the upper surface of the substrate 110 having the gate insulating layer 112 and the data insulating layer 114 formed thereon. The first planarization layer 120 may serve to eliminate and planarize a surface level difference in order to prevent a defect such as disconnection or short circuit of a connection line formed thereon. The planarization layer 120 may include a material including polyamide having planarization characteristics. As described above, by using polyamide to improve the planarization characteristics of the planarization layer 120, another layer that may be formed on the planarization layer 120 may have a uniform thickness.

Figure 5C:
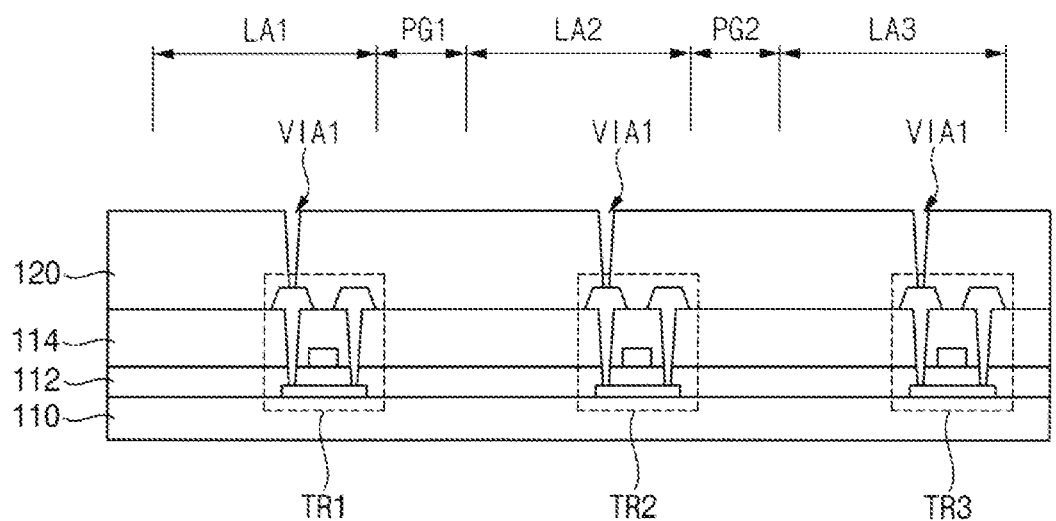

Referring to FIG. 5C, first via holes VIA1 exposing portions of drain electrodes of each of the first to third thin film transistors TR1, TR2 and TR3 are formed.

Figure 5D:
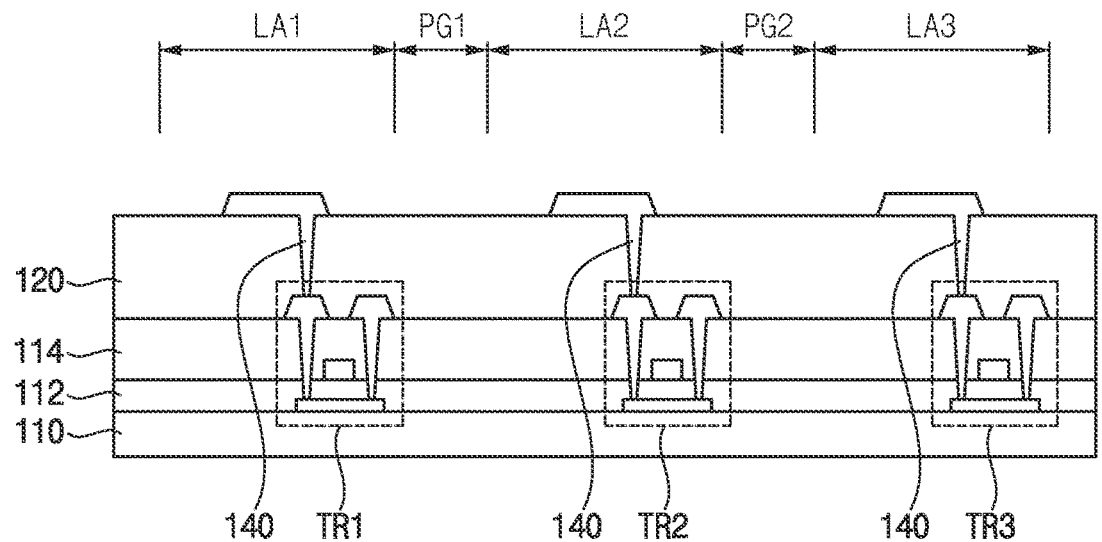

Referring to FIG. 5D, contact metals 140 may be formed on the planarization layer 120 in which the first via holes VIA1 are formed, and electrically connected to the drain electrodes through the first via holes VIA1. For example, a conductive layer may be formed on the planarization layer 120 in which the first via holes VIA1 are formed. The conductive layer may include a highly conductive metal material used as an electrode material. The conductive layer may include an alloy containing materials such as Al, Ti, Mo, Ag, Cr and the like. The conductive layer may be patterned to have a conductive pattern by a photo process using a photo mask (not shown). The photo process may be applied to a general photo lithography process. For example, a photoresist film (not shown) may be formed on the conductive layer and exposed through a photo mask (not shown). Subsequently, the conductive layer may be patterned to form the conductive pattern through development and etching processes, and the photoresist film remaining on the conductive layer may be removed. The conductive pattern may correspond to the contact metals 140 electrically connected to each of the drain electrodes through the first via holes VIA1.

Figure 5E:
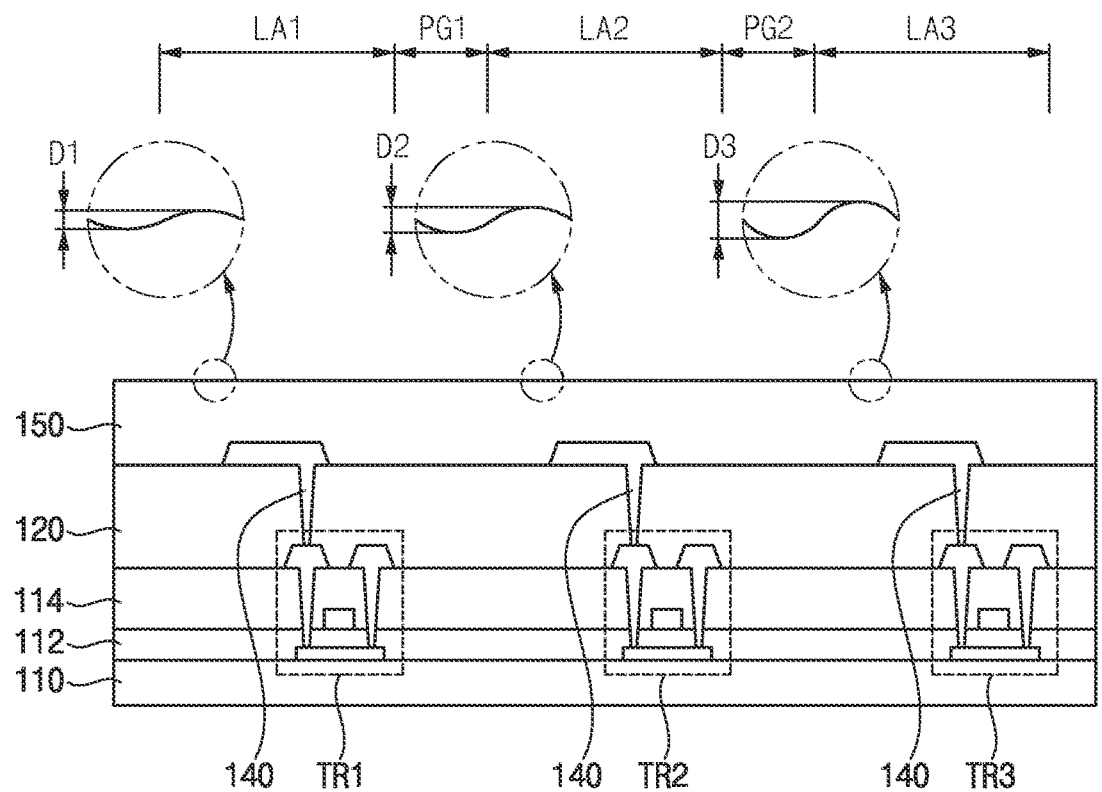

Referring to FIG. 5E, a second planarization layer 150 is formed to planarize upper portions of the contact metals 140 and the first planarization layer 120. A surface level difference of the second planarization layer 150 corresponding to the second light-emitting area LA2 may be greater than a surface level difference of the second planarization layer 150 corresponding to the first light-emitting area LA1 and may be smaller than a surface level difference of the second planarization layer 150 corresponding to the third light-emitting area LA3.

In the embodiment, a surface level difference of the second planarization layer 150 corresponding to the first light-emitting area LA1 may be set to about 30 nm or less, a surface level difference of a second planarization layer 150 corresponding to the second light-emitting area LA2 may be set to about 40 nm or less, and a surface level difference of the second planarization layer 150 corresponding to the third light-emitting area LA3 may be set to about 100 nm or less. A first, second, and third surface level difference of various portions of the second planarization layer 150 is shown in FIG. 5E (as D1, D2, and D3 respectively) for each of the light-emitting areas LA1, LA2 and LA3.

The second planarization layer 150 may serve to eliminate and planarize a surface level difference in order to prevent a defect such as disconnection or short circuit of a connection line formed thereon. The second planarization layer 150 may include a material including polyamide having planarization characteristics. As described above, by using polyamide to improve the planarization characteristics of the second planarization layer 150, another layer that is formed on the second planarization layer 150 may have a uniform thickness. Thus, it may be possible to form an organic light-emitting layer having a uniform luminance, so that it may be possible to increase the luminous efficiency. Moreover, it may be possible to prevent defects such as disconnection and short circuit of several conductive layers that may be formed on the second planarization layer 150.

Figure 5F:
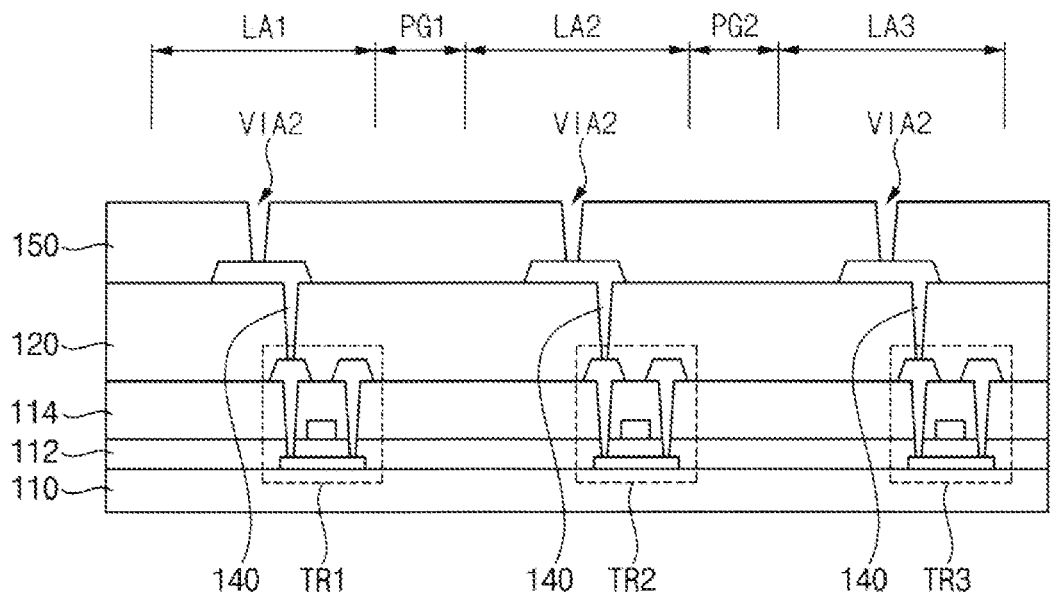

Referring to FIG. 5F, second via holes VIA2 exposing a portion of the contact metal 140 are formed in correspondence with each of the first to third light-emitting areas LA1, LA2 and LA3.

Figure 5G:
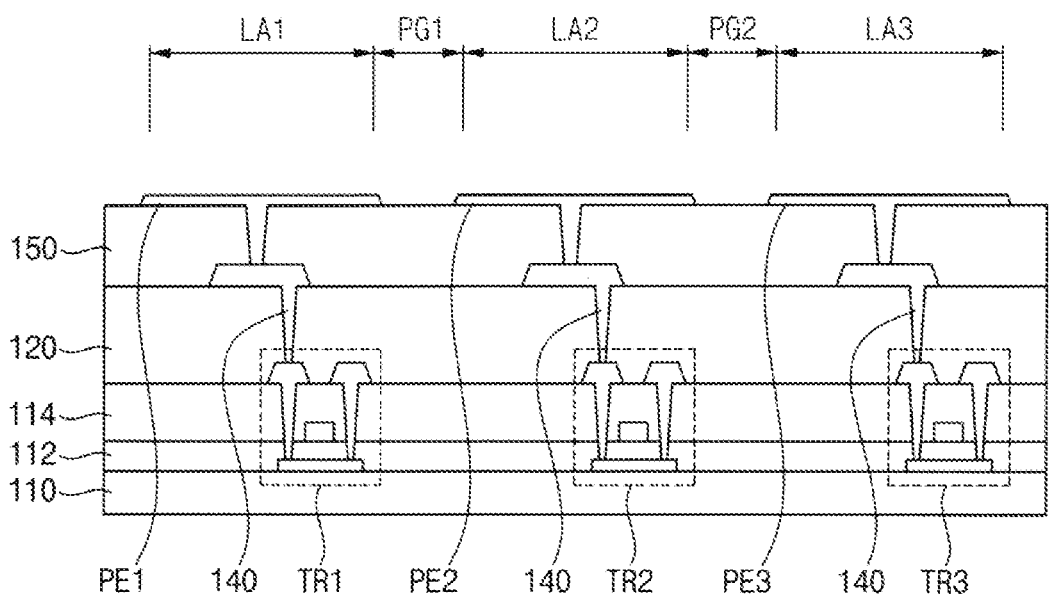

Referring to FIG. 5G, pattern electrodes PE1, PE2 and PE3 may be formed on the second planarization layer 150 in which the second via holes VIA2 are formed, and electrically connected to the contact metals 140 through the second via holes VIA2. For example, a conductive layer is formed on the second planarization layer 150 in which the second via holes VIA2 are formed. The conductive layer may include a highly conductive metal material used as an electrode material. The conductive layer may include an alloy containing materials such as Al, Ti, Mo, Ag, Cr and the like. The conductive layer is patterned to have a conductive pattern by a photo process using a photo mask (not shown). The photo process may be applied to a general photo lithography process. For example, a photoresist film (not shown) is formed on the conductive layer and exposed through a photo mask (not shown). Subsequently, the conductive layer is patterned to form the conductive pattern through development and etching processes, and the photoresist film remaining on the conductive layer is removed. The conductive pattern corresponds to the pattern electrodes PE1, PE2 and PE3 electrically connected to each of the contact metals 140 through the second via holes VIA2.

Figure 5H:
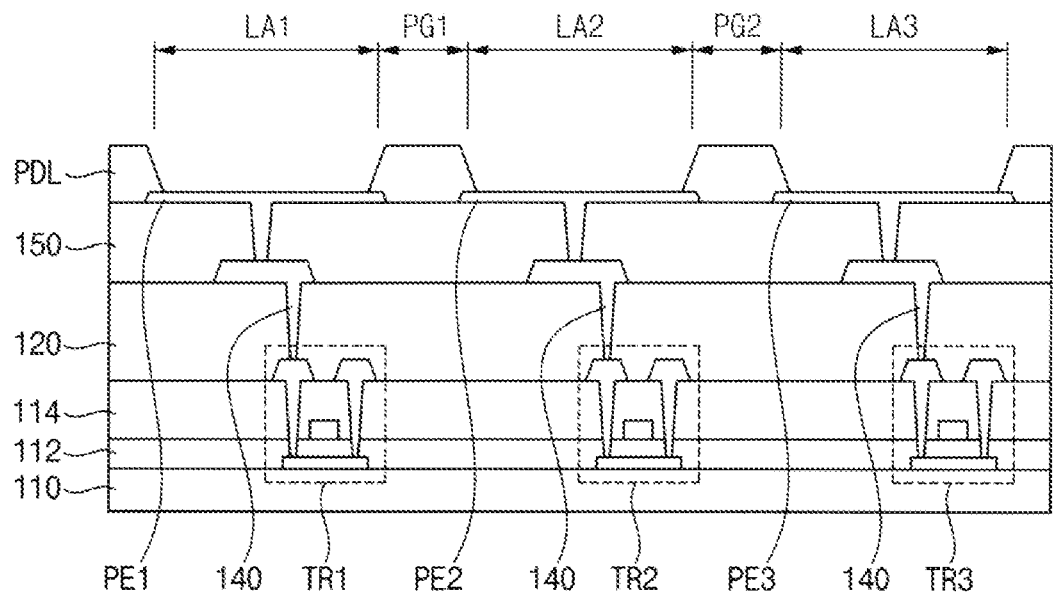

Referring to FIG. 5H, a pixel defining layer PDL is formed on the second planarization layer 150. The pixel defining layer PDL may expose the pattern electrodes PE1, PE2 and PE3 through openings formed to define pixels. For example, a photoresist composition including phenol resin, acrylic resin, polyimide resin, polyamide resin, siloxane resin, epoxy resin, etc. may be coated on the second planarization layer 150, and the coated photoresist composition may be exposed and developed to form the pixel defining layer PDL having the openings.

Figure 5I:
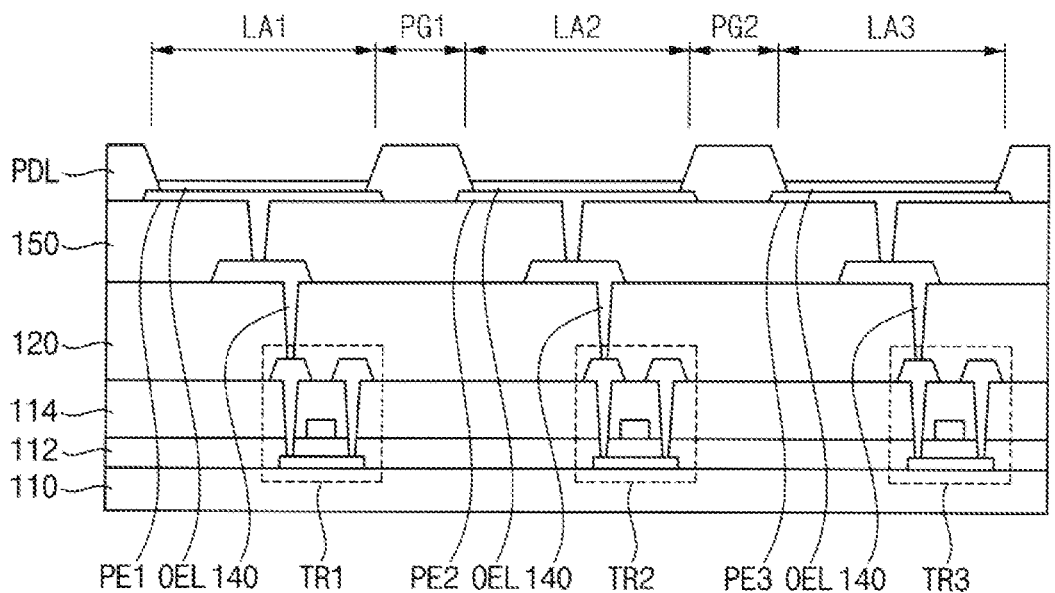

Referring to FIG. 5I, organic light-emitting layers OEL formed on the pattern electrodes PE1, PE2 and PE3 exposed by the pixel defining layer PDL are formed. In an embodiment, the organic light-emitting layer OEL may be formed through an inkjet printing process. The inkjet printing process is a method of discharging a liquid material along a pattern in several to tens of pico droplets along a pattern using fine nozzles and drying the discharged liquid material to form a pattern layer. Since the inkjet printing process does not require a separate mask, the process cost may be low and it may be advantageous for a large area.

A common electrode CE (see FIG. 4) may be formed on the pixel defining layer PDL and the organic light-emitting layers OEL to manufacture an organic light-emitting display device as illustrated in FIG. 4. Accordingly, as the pattern electrodes PE1, PE2 and PE3, the organic light-emitting layer OEL and the common electrode CE are formed, an organic light-emitting diode (OLED) as a light-emitting device may be formed.

As described above, since each color sub-pixel has a different level of allowable surface level difference, it is possible to prevent deterioration of the light-emitting characteristics of each color by designing a different level of surface level of each color sub-pixel in consideration of the allowable flatness of each color sub-pixel. It is also possible to suppress or mitigate deterioration of the light-emitting characteristics of each color by separately designing the shape of each color sub-pixel in consideration of the allowable flatness of each color sub-pixel without a special planarization process.

Having described embodiments of the disclosure, it is further noted that it is readily apparent to those of reasonable skill in the art that various modifications may be made without departing from the spirit and scope of the invention which is defined by the metes and bounds of the appended claims.

What is claimed is:
1. A light-emitting display device comprising:
a plurality of unit pixels, each of the plurality of unit pixels comprising:
a first sub-pixel comprising a red organic light-emitting layer to emit red light and having a first surface level difference, the first surface level difference being a difference in height between a minimum level and a maximum level of a first portion of a top surface of a planarization layer arranged within the first sub-pixel;
a second sub-pixel comprising a green organic light-emitting layer to emit green light and having a second surface level difference, the second surface level difference being a difference in height between a minimum level and a maximum level of a second portion of the top surface of the planarization layer arranged within the second sub-pixel; and
a third sub-pixel that includes a blue organic light-emitting layer to emit blue light and having a third surface level difference, the third surface level difference being a difference in height between a minimum level and a maximum level of a third portion of the top surface of the planarization layer arranged within the third sub-pixel, wherein
the second surface level difference of the second sub-pixel is greater than the first surface level difference of the first sub-pixel and smaller than the third surface level difference of the third sub-pixel, and
the first surface level difference of the first sub-pixel is about 30 nm or less.

2. The light-emitting display device of claim 1, wherein
the second surface level difference of the second sub-pixel
is about 40 nm or less, and
the third surface level difference of the third sub-pixel is
about 100 nm or less.

3. The light-emitting display device of claim 1, wherein
the planarization layer has a single layer.

4. The light-emitting display device of claim 1, wherein
the planarization layer comprises a first planarization
layer and a second planarization layer formed on the
first planarization layer, and
each of the first, second, and third surface level differences is a surface level difference of the second planarization layer corresponding to each of the first, second, and third sub-pixels, respectively.

5. The light-emitting display device of claim 1, wherein
sizes of the first sub-pixel, the second sub-pixel, and the
third sub-pixel are different from each other.

6. The light-emitting display device of claim 5, wherein
an area of the second sub-pixel is larger than an area of the
first sub-pixel and smaller than an area of the third sub-pixel.

7. The light-emitting display device of claim 1, wherein
shapes of the first sub-pixel, the second sub-pixel, and the
third sub-pixel are different from each other.

8. A light-emitting display device comprising:
a substrate including a red light-emitting area, a green
light-emitting area, and a blue light-emitting area;
a driving element comprising a first thin film transistor
(TFT) formed in the red light-emitting area, a second
TFT formed in the green light-emitting area, and a third
TFT formed in the blue light-emitting area;
a planarization layer covering the first, second, and third
TFTs and including via holes that are through-holes in
the planarization layer at locations corresponding to at
least a part of each of drain electrodes of the first,
second, and third TFTs;
a light-emitting element comprising:
pattern electrodes electrically connected to the drain electrodes through the via holes,
a red organic light-emitting layer disposed on one of the
pattern electrodes that corresponds to the first TFT,
a green organic light-emitting layer disposed on another
one of the pattern electrodes that corresponds to the
second TFT,
a blue organic light-emitting layer disposed on yet another
one of the pattern electrodes that corresponds to the
third TFT, and
a common electrode covering the red organic light-emitting layer, the green organic light-emitting layer, and
the blue organic light-emitting layer; and
a pixel defining layer covering at least a part of each of the
pattern electrodes electrically connected to the drain
electrodes and at least a part of the planarization layer
exposed by the pattern electrodes, wherein
a surface level difference of the planarization layer corresponding to the green organic light-emitting layer is
greater than a surface level difference of the planarization layer corresponding to the red organic light-emitting layer and smaller than a surface level difference of
the planarization layer corresponding to the blue
organic light-emitting layer, and
the surface level difference of the planarization layer
corresponding to the red, green, and blue organic
light-emitting layers being a difference between minimum and maximum levels of portions of a surface of
the planarization layer corresponding to the red, green,
and blue organic light-emitting layers, respectively, and the surface level difference of the planarization layer
corresponding to the red organic light-emitting layer is
about 30 nm or less.

9. The light-emitting display device of claim 8, wherein
the surface level difference of the planarization layer
corresponding to the green organic light-emitting layer
is about 40 nm or less, and
the surface level difference of the planarization layer
corresponding to the blue organic light-emitting layer is
about 100 nm or less.

10. The light-emitting display device of claim 8, wherein
sizes of the red organic light-emitting layer, the green
organic light-emitting layer, and the blue organic light-emitting layer exposed by the pixel defining layer are
different from each other.

11. The light-emitting display device of claim 10, further
comprising:
a red sub-pixel corresponding to the red light-emitting
area, a green sub-pixel corresponding to the green
light-emitting area, and a blue sub-pixel corresponding
to the blue light-emitting area,
wherein an area of the green sub-pixel exposed by the
pixel defining layer is larger than an area of the red
sub-pixel exposed by the pixel defining layer and is
smaller than an area of the blue sub-pixel exposed by
the pixel defining layer.

12. The light-emitting display device of claim 11, wherein
shapes of the red sub-pixel, the green sub-pixel, and the blue
sub-pixel are different from each other.

13. A method of manufacturing a light-emitting display
device, the method comprising:
forming a first thin film transistor (TFT), a second TFT,
and a third TFT in a red light-emitting area, a green
light-emitting area, and a blue light-emitting area,
respectively, on a substrate;
forming a planarization layer covering the first, second,
and third TFTs and including via holes exposing at least
a part of each of drain electrodes of the first, second,
and third TFTs;
forming pattern electrodes electrically connected to the
drain electrodes of the first, second, and third TFTs
through the via holes;
forming a pixel defining layer covering at least a part of
each of the pattern electrodes and at least a part of the
planarization layer exposed by the pattern electrodes;
forming a red organic light-emitting layer, a green organic
light-emitting layer, and a blue organic light-emitting
layer on the pattern electrode corresponding to the first
TFT, the pattern electrode corresponding to the second
TFT, and the pattern electrode corresponding to the
third TFT, respectively; and
forming a common electrode covering the pixel defining
layer and the, red, green, and blue organic light-emitting layers, wherein
a surface level difference of the planarization layer corresponding to the green organic light-emitting layer is
greater than a surface level difference of the planarization layer corresponding to the red organic light-emitting layer and smaller than a surface level difference of
the planarization layer corresponding to the blue
organic light-emitting layer,
the surface level difference of the planarization layer
corresponding to the red, green and blue organic light-emitting layers being a difference between minimum
and maximum levels of portions of a surface of the
planarization layer corresponding to the red, green, and
blue organic light-emitting layers respectively, and the surface level difference of the planarization layer corresponding to the red organic light-emitting layer is about 30 nm or less.

14. The method of claim 13, wherein
the surface level difference of the planarization layer corresponding to the green organic light-emitting layer is about 40 nm or less, and
the surface level difference of the planarization layer corresponding to the blue organic light-emitting layer is about 100 nm or less.

15. The method of claim 13, wherein an area of the green organic light-emitting layer exposed by the pixel defining layer is larger than an area of the red organic light-emitting layer exposed by the pixel defining layer and smaller than an area of the blue organic light-emitting layer exposed by the pixel defining layer.

16. The method of claim 13, wherein the red organic light-emitting layer, the green organic light-emitting layer, and the blue organic light-emitting layer are formed by an inkjet printing process.

17. A method of manufacturing a light-emitting display device, the method comprising:
forming a first thin film transistor (TFT), a second TFT, and a third TFT in a first light-emitting area, a second light-emitting area, and a third light-emitting area, respectively, on a substrate, respectively;
forming a first planarization layer covering the first, second, and third TFTs and including first via holes exposing at least a part of each of drain electrodes of the first, second, and third TFTs;
forming contact metals electrically connected to the drain electrodes through the first via holes;
forming a second planarization layer covering at least a part of each of the contact metals and at least a part of the first planarization layer and including second via holes exposing at least a part of each of the contact metals;
forming pattern electrodes electrically connected to the contact metals through the second via holes;
forming a pixel defining layer on the second planarization layer to expose the pattern electrodes through openings formed to define a plurality of pixels; and
forming a red organic light-emitting layer, a green organic light-emitting layer, and a blue organic light-emitting layer on one of the pattern electrodes that corresponds to the first TFT, another one of the pattern electrodes that corresponds to the second TFT, and another one of the pattern electrodes that corresponds to the third TFT, respectively, wherein
a surface level difference of the second planarization layer corresponding to the green organic light-emitting layer is greater than a surface level difference of the second planarization layer corresponding to the red organic light-emitting layer and smaller than a surface level difference of the second planarization layer corresponding to the blue organic light-emitting layer,
the surface level difference of the second planarization layer corresponding to the red, green, and blue organic light-emitting layers being a difference between minimum and maximum levels of portions of a surface of the second planarization layer corresponding to the red, green and blue organic light-emitting layers respectively, and
the surface level difference of the second planarization layer corresponding to the red organic light-emitting layer is about 30 nm or less.

18. The method of claim 17, wherein
the surface level difference of the second planarization layer corresponding to the green organic light-emitting layer is about 40 nm or less, and
the surface level difference of the second planarization layer corresponding to the blue organic light-emitting layer is about 100 nm or less.

19. The method of claim 17, wherein the red organic light-emitting layer, the green organic light-emitting layer, and the blue organic light-emitting layer are formed by an inkjet printing process.

* * * * *